(12) United States Patent
Huang et al.

(10) Patent No.: US 6,972,216 B2
(45) Date of Patent: Dec. 6, 2005

(54) SEMICONDUCTOR PACKAGE WITH ENHANCED ELECTRICAL AND THERMAL PERFORMANCE AND METHOD FOR FABRICATING THE SAME

(75) Inventors: Chien-Ping Huang, Hsinchu (TW); Chih-Ming Huang, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 93 days.

(21) Appl. No.: 10/768,307

(22) Filed: Jan. 29, 2004

(65) Prior Publication Data

US 2004/0183174 A1    Sep. 23, 2004

Related U.S. Application Data

(62) Division of application No. 10/157,069, filed on May 29, 2002, now Pat. No. 6,703,698.

(30) Foreign Application Priority Data

Dec. 21, 2001    (TW) .............................. 90131811 A

(51) Int. Cl.[7] .............................................. H01L 21/50
(52) U.S. Cl. ....................... 438/122; 438/106; 438/124
(58) Field of Search ................................ 438/122, 106, 438/124

(56) References Cited

U.S. PATENT DOCUMENTS 5,851,337 A    12/1998    Chen
6,599,779 B2 *    7/2003    Shim et al. .................. 438/122

* cited by examiner

Primary Examiner—Roy Potter
(74) Attorney, Agent, or Firm—Peter F. Corless; Steven M. Jensen; Edwards & Angell, LLP

(57) ABSTRACT

A BGA (ball grid array) package with enhanced electrical and thermal performance, and a method for fabricating the BGA package, are proposed. This BGA package is characterized by the use of a power-connecting heat spreader and a ground-connecting heat spreader, which are respectively used to electrically connect power pad and ground pad to a packaged chip as well as to dissipate heat generated by the chip during operation. The ground-connecting heat spreader is arranged to entirely cover the chip, and thereby provides good shielding effect for the chip, which helps improve electrical performance of the chip during operation. Further, the ground-connecting heat spreader is partly exposed to outside of an encapsulation body that encapsulates the chip, by which satisfactory heat-dissipation efficiency can be achieved.

7 Claims, 3 Drawing Sheets

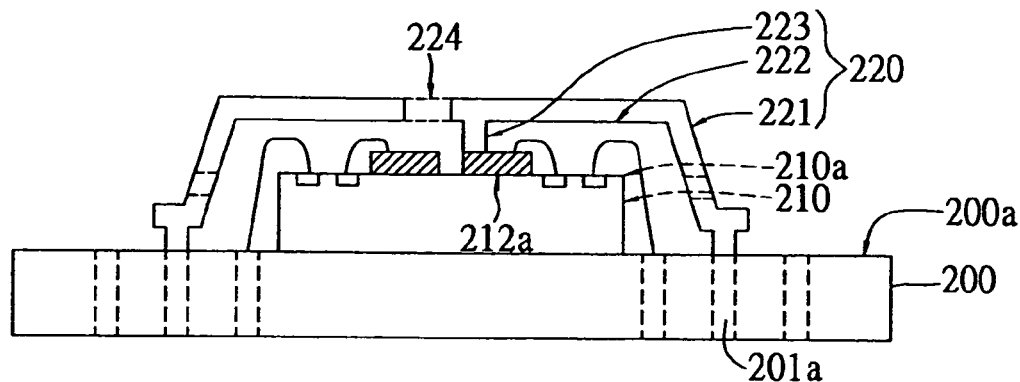
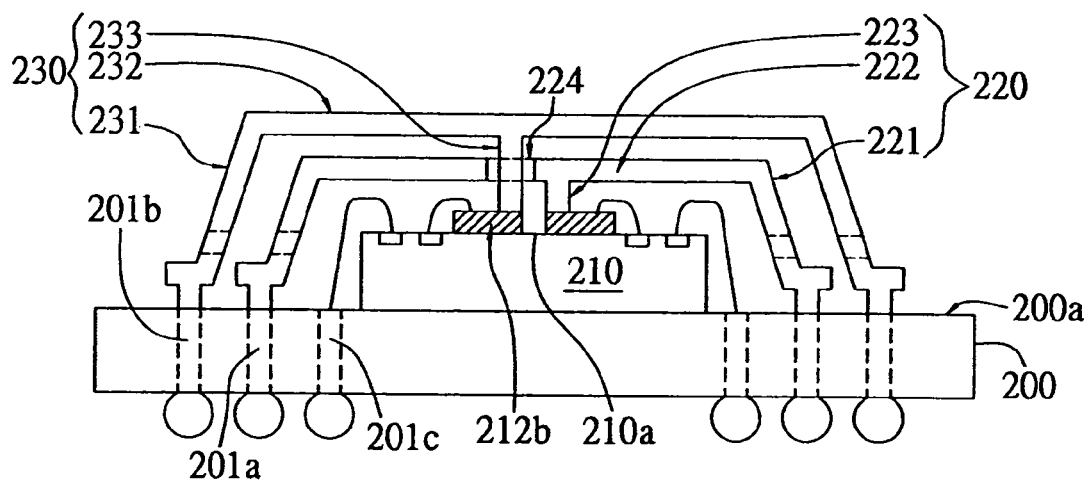
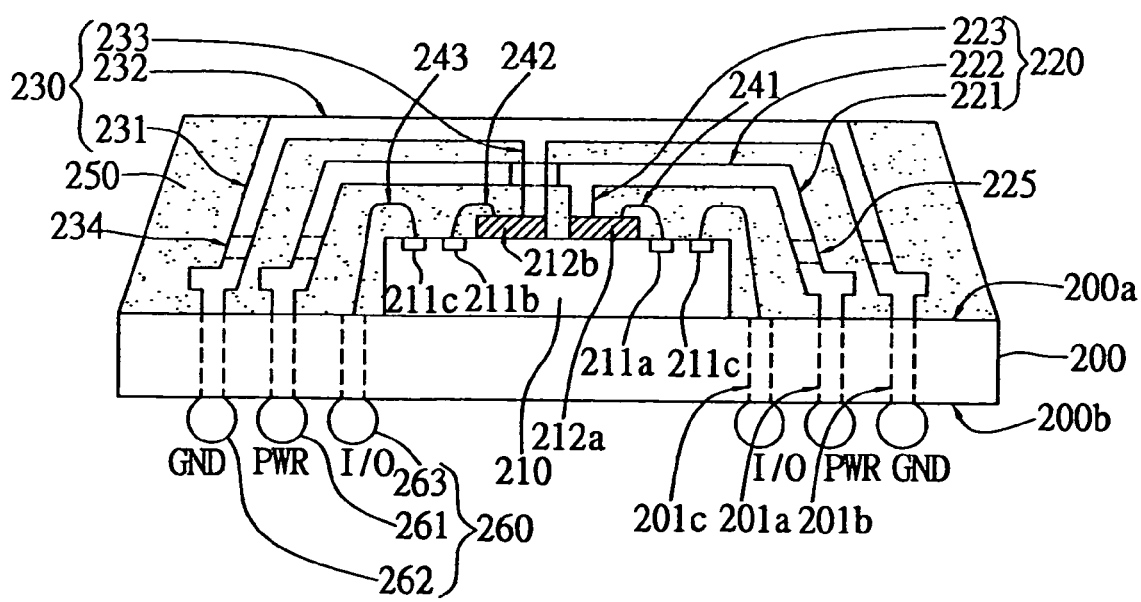

SEMICONDUCTOR PACKAGE WITH ENHANCED ELECTRICAL AND THERMAL PERFORMANCE AND METHOD FOR FABRICATING THE SAME

CROSS-REFERENCE TO RELATED APPLICATION(S)

This application is a divisional of copending application U.S. Ser. No. 10/157,069, now U.S. Pat. No. 6,703,698 filed on May 29, 2002.

FIELD OF THE INVENTION

The present invention relates to semiconductor packages and fabrication methods thereof, and more particularly, to a BGA (ball grid array) package with enhanced electrical and thermal performance, and a method for fabricating the BGA package.

BACKGROUND OF THE INVENTION

BGA (ball grid array) is an advanced type of semiconductor packaging technology, which is characterized by the use of a substrate as a chip carrier whose front surface is used for mounting one or more semiconductor chips and whose back surface is provided with a plurality of array-arranged solder balls. During a SMT (surface mount technology) process, a BGA package can be mechanically bonded and electrically coupled to an external device such as a printed circuit board (PCB) by means of these solder balls.

Patents related to BGA technology include, for example, U.S. Pat. No. 5,851,337 entitled "METHOD OF CONNECTING TEHS ON PBGA AND MODIFIED CONNECTING STRUCTURE". This patent is characterized by the use of a ground circuit for connecting a heat spreader to a substrate to help enhance grounding effect of a BGA package. One drawback to this patent, however, is that it is unsuitably used for packaging semiconductor chips having a great number of power and ground pads.

A conventional solution to the foregoing problem is depicted with reference to FIGS. 1A and 1B. As shown, an exemplified BGA package comprises: a substrate 100, at least a semiconductor chip 110, a power-connecting heat spreader 120, a ground-connecting heat spreader 130, a plurality of sets of bonding wires 141, 142, 143, an encapsulation body 150, and a plurality of array-arranged solder balls 160.

The substrate 100 has a front surface 100a and a back surface 100a and is formed with a plurality of electrically-conductive vias 101a, 101b, 101c at predetermined positions, including power vias 101a, ground vias 101b and I/O (input/output) vias 101c, which are adapted to penetrate through the substrate 100.

The semiconductor chip 110 has an active surface 110a and an inactive surface 110b. The active surface 110a is formed with a plurality of bond pads 111a, 111b, 111c, including power pads 111a, ground pads 111b and I/O pads 111c. This active surface 110a of the semiconductor chip 110 is further formed with a power plane 112a and a ground plane 112b, wherein the power plane 112a is electrically connected to the power pads 111a by a first set of bonding wires 141, and the ground plane 112b is electrically connected to the ground pads 111b by a second set of bonding wires 142. Further, the I/O pads 111c are electrically connected by a third set of bonding wires 143 to the I/O vias 101c on the front surface 100a of the substrate 100.

The power-connecting heat spreader 120 is integrally formed by a support portion 121, an overhead portion 122 and a downward-extending portion 123. The power-connecting heat spreader 120 is mounted over the substrate 100 to partly cover the semiconductor chip 110, wherein the support portion 121 is electrically bonded to the power vias 101a of the substrate 100, and the downward-extending portion 123 is electrically bonded to the power plane 112a on the semiconductor chip 110, allowing the overhead portion 122 to be elevated in position above the semiconductor chip 110 by the support portion 121 and the downward-extending portion 123. The power-connecting heat spreader 120 is used to connect power to the semiconductor chip 110, and to dissipate heat generated by the semiconductor chip 110 during operation.

Similarly, the ground-connecting heat spreader 130 is composed of a support portion 131, an overhead portion 132 and a downward-extending portion 133. The ground-connecting heat spreader 130 is mounted over the substrate 100 to partly cover the semiconductor chip 110, wherein the support portion 131 is electrically bonded to the ground vias 101b of the substrate 100, and the downward-extending portion 133 is electrically bonded to the ground plane 112b on the semiconductor chip 110, allowing the overhead portion 132 to be elevated in position above the semiconductor chip 110 by the support portion 131 and the downward-extending portion 133. The ground-connecting heat spreader 130 is used to connect the semiconductor chip 110 to ground, and to dissipate heat generated by the semiconductor chip 110 during operation.

The encapsulation body 150 is formed to encapsulate the front surface 100a of the substrate 100, the semiconductor chip 110, the power-connecting heat spreader 120, and the ground-connecting heat spreader 130. In view of power transmission and grounding purposes, the power-connecting heat spreader 120 and the ground-connecting heat spreader 130 are preferably not exposed to outside of the encapsulation body 150.

The array-arranged solder balls 160 are implanted on the back surface 100b of the substrate 100, including a plurality of power balls 161 electrically connected to the power vias 101a, a plurality of ground balls 162 electrically connected to the ground vias 101b, and a plurality of I/O balls 163 electrically connected to the I/O vias 101c.

By the above structure as illustrated in FIG. 1A, power can be externally supplied to the semiconductor chip 110 successively via the power balls 161, the power vias 101a, the power-connecting heat spreader 120, the power plane 112a, the bonding wires 141, and the power pads 111a. Moreover, the semiconductor chip 110 can be connected to ground successively via the ground pads 111b, the bonding wires 142, the ground plane 112b, the ground-connecting heat spreader 130, the ground vias 101b, and the ground balls 162. Further, the semiconductor chip 110 can transfer I/O signals via the I/O pads 111c, the bonding wires 143, the I/O vias 101c, and the I/O balls 163.

One drawback to the forgoing BGA package, however, is that, since the ground-connecting heat spreader 130 only covers part of the semiconductor chip 110, it would not be able to provide good EMI (electromagnetic interference) shielding effect for the semiconductor chip 110 during operation.

Moreover, since both the power-connecting heat spreader 120 and the ground-connecting heat spreader 130 are completely enclosed by the encapsulation body 150, they may not provide satisfactory heat-dissipation efficiency for the packaged semiconductor chip 110.

SUMMARY OF THE INVENTION

An objective of this invention is to provide a semiconductor package with enhanced electrical and thermal performance, which provides good EMI (electromagnetic interference) shielding effect.

Another objective of this invention is to provide a semiconductor package with enhanced electrical and thermal performance, by which satisfactory heat-dissipation efficiency is achieved.

A further objective of this invention is to provide a semiconductor package with enhanced electrical and thermal performance, wherein the semiconductor package is cost-effectively fabricated.

In accordance with the above and other objectives, the present invention proposes a BGA semiconductor package and a method for fabricating the same.

The BGA semiconductor package of the invention comprises: a substrate having a front surface and a back surface opposed to the front surface; at least a chip having an active surface and an inactive surface opposed to the active surface, wherein the active surface is formed with a power plane and a ground plane, and the inactive surface is mounted on the front surface of the substrate; a power-connecting heat spreader adapted to entirely cover the chip, and electrically bonded to the front surface of the substrate and the power plane on the chip; a ground-connecting heat spreader positioned in elevation above the power-connecting heat spreader, and adapted to be electrically bonded to the front surface of the substrate and the ground plane on the chip; an encapsulation body for encapsulating the front surface of the substrate, the chip, the power-connecting heat spreader and the ground-connecting heat spreader; and a plurality of solder balls implanted on the back surface of the substrate.

The above package structure is characterized by the use of a specially-designed set of power-connecting heat spreader and ground-connecting heat spreader, which are each electrically connected to and structured to entirely cover an underlying chip. Thereby, the power-connecting heat spreader allows external power to be efficiently supplied to the chip, and the ground-connecting heat spreader would provide good EMI shielding effect for allowing the chip to improve its electrical performance during operation. Further, a top surface of the ground-connecting heat spreader is adapted to be exposed to outside of an encapsulation body that encapsulates the chip, thereby helping enhancing heat-dissipation efficiency for the package structure.

BRIEF DESCRIPTION OF THE DRAWINGS

The present invention can be more fully understood by reading the following detailed description of the preferred embodiments, with reference made to the accompanying drawings, wherein:

FIGS. 2A–2E are schematic diagrams used to depict a preferred embodiment of a semiconductor package of the invention.

DETAILED DESCRIPTION OF THE PREFERRED EMBODIMENTS

Figure 1A:
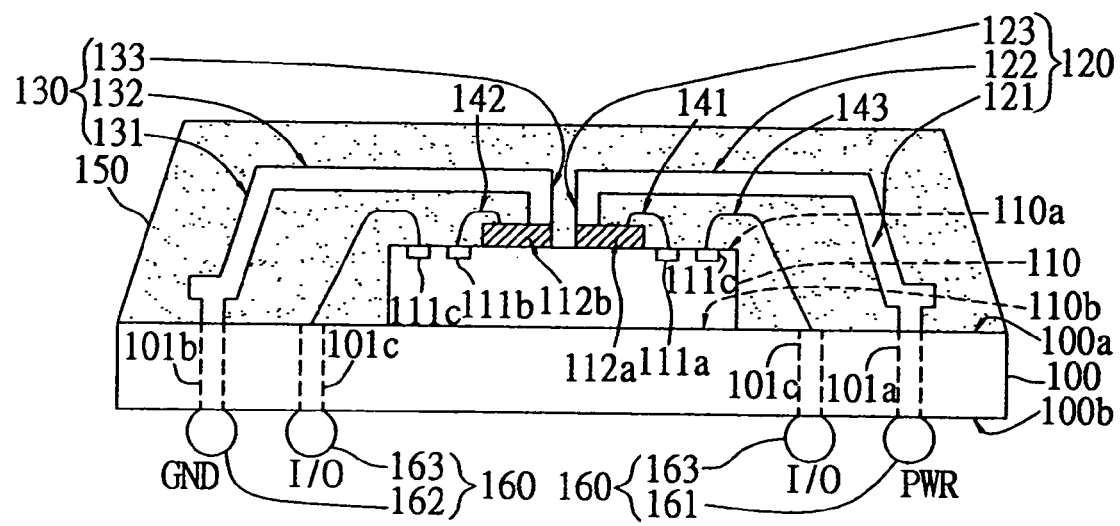
FIGS. 1A–1B (PRIOR ART) are schematic diagrams used to depict the structure of a conventional BGA package.

The following description is made with reference to FIGS. 2A–2E, for detailing preferred embodiments of a BGA (ball grid array) semiconductor package proposed in the present invention.

As shown in FIG. 2E, the BGA semiconductor package of the invention comprises: a substrate 200 having a front surface 200a and a back surface 200b opposed to the front surface 200a; at least a chip 210 having an active surface 210a and an inactive surface 210b opposed to the active surface 210a, wherein the active surface 210a is formed with a power plane 212a and a ground plane 212b, and the inactive surface 210b is mounted on the front surface 200a of the substrate 200; a power-connecting heat spreader 220 adapted to entirely cover the chip 210, and electrically bonded to the front surface 200a of the substrate 200 and the power plane 212a on the chip 210; a ground-connecting heat spreader 230 positioned in elevation above the power-connecting heat spreader 220, and adapted to be electrically bonded to the front surface 200a of the substrate 200 and the ground plane 212b on the chip 210; an encapsulation body 250 for encapsulating the front surface 200a of the substrate 200, the chip 210, the power-connecting heat spreader 220 and the ground-connecting heat spreader 230; and a plurality of solder balls 260 implanted on the back surface 200b of the substrate 200.

The above BGA semiconductor package can be fabricated by the following steps as illustrated in FIGS. 2A to 2E.

Figure 2A:
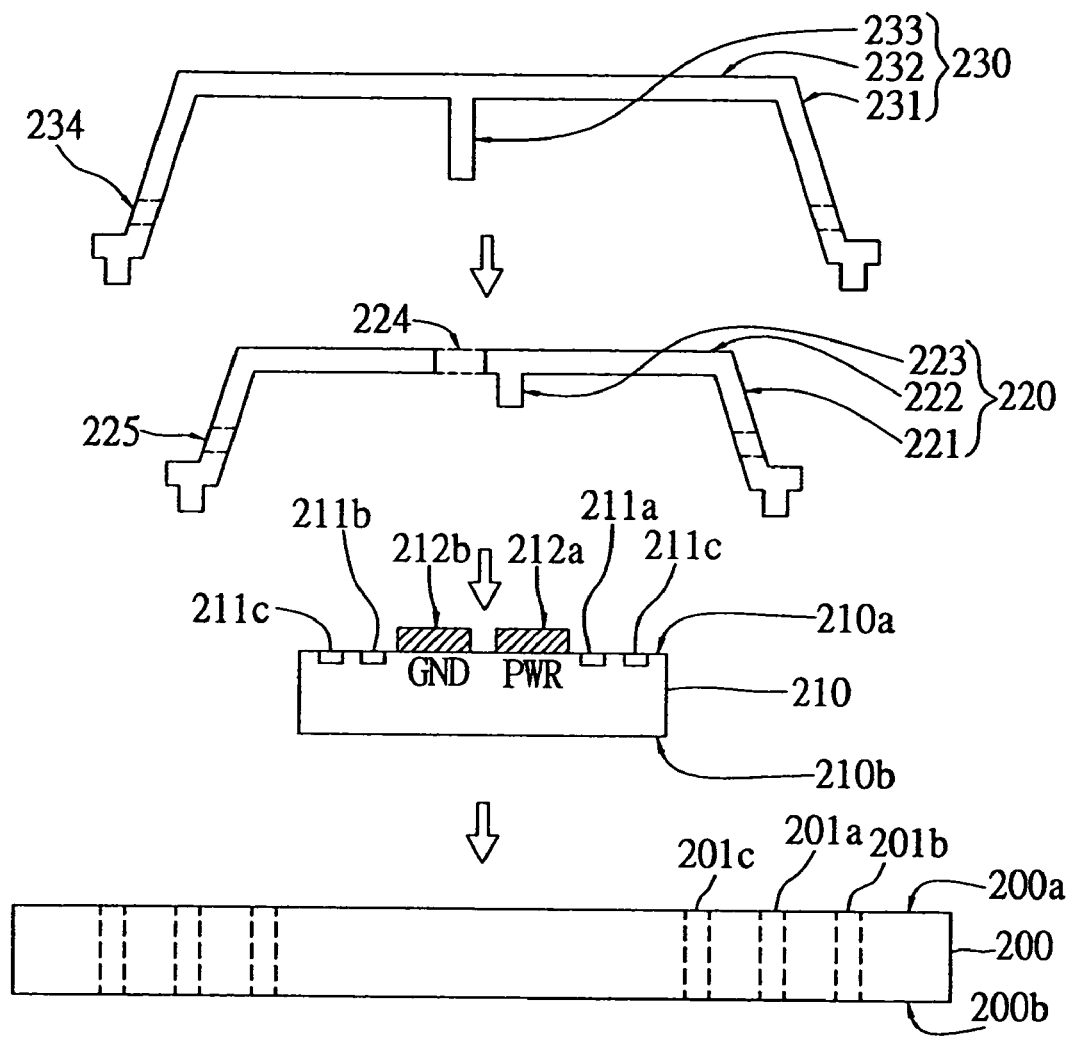

Referring to FIG. 2A, the first step is to prepare a substrate 200, a chip 210, a power-connecting heat spreader 220, and a ground-connecting heat spreader 230.

The substrate 200 has a front surface 200a and a back surface 200b, with a plurality of power vias 201a, ground vias 201b and I/O (input/output) vias 201c being formed to penetrate through the substrate 200.

The chip 210 has an active surface 210a and an inactive surface 210b. The active surface 210a is formed with a plurality of power pads 211a, ground pads 211b and I/O pads 211c. The active surface 210a is further formed with a power plane 212a and a ground plane 212b, wherein the power plane 212a is electrically connected to the power pads 211a by a first set of bonding wires 241 (shown in FIG. 2B), and the ground plane 212b is electrically connected to the ground pads 211b by a second set of bonding wires 242 (shown in FIG. 2B). Besides the use of wire-bonding technology, other electrical connection methods, such as TAB (Tape Automatic Bond) technology, are also suitably adopted for electrically connecting the power plane 212a and the ground plane 212b respectively to the power pads 211a and the ground pads 211b.

The power-connecting heat spreader 220 and the ground-connecting heat spreader 230 are each an integrally-formed piece of electrically-and-thermally conductive material, such as copper.

The power-connecting heat spreader 220 includes a support portion 221, an over-head portion 222 supported on the support portion 221, and a downward-extending portion 223 protruding downwardly from the overhead portion 222. The overhead portion 222 is formed with an opening 224, and sized in area to be equal to or slightly larger than the chip 210. And, the support portion 221 is formed with a plurality of mold-flow openings 225.

The ground-connecting heat spreader 230 includes a support portion 231, an over-head portion 232 supported on the support portion 231, and a downward-extending portion 233 protruding downwardly from the overhead portion 232. The overhead portion 232 is sized in area to be equal to or slightly larger than the overhead portion 222 of the power-connecting heat spreader 220. And, the support portion 231 is formed with a plurality of mold-flow openings 234.

Figure 2B:
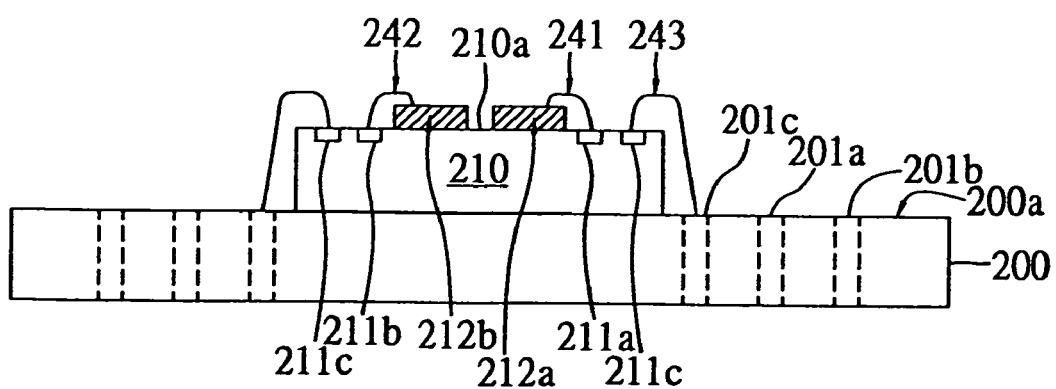

Referring FIG. 2B, the next step is to mount the chip 210 on the front surface 200a of the substrate 200, wherein the power plane 212a is electrically connected to the power pads 211a by the first set of bonding wires 241, and the ground plane 212b is electrically connected to the ground pads 211b by the second set of bonding wires 242. And, a third set of bonding wires 243 are formed for electrically connecting the I/O pads 211c on the chip 210 to the I/O vias 201c of the substrate 200.

Referring further to FIG. 2C, the power-connecting heat spreader 220 is mounted over the front surface 200a of the substrate 200 to entirely cover the chip 210 in a manner that, the support portion 221 is electrically bonded to the power vias 201a of the substrate 200, and the downward-extending portion 223 is electrically connected to the power plane 212a on the chip 210, allowing the overhead portion 222 to be elevated in position above the chip 210 by the support portion 221 and the downward-extending portion 223, and not to interfere with the bonding wires 241, 242, 243.

Referring to FIG. 2D, the ground-connecting heat spreader 230 is mounted over the front surface 200a of the substrate 200 to entirely cover the chip 210 in a manner that, the support portion 231 is bonded to the ground vias 201b of the substrate 200, and the downward-extending portion 233 penetrates through the opening 224 of the power-connecting heat spreader 220 to be electrically bonded to the ground plane 212b on the chip 210, allowing the overhead portion 232 to be elevated in position above the power-connecting heat spreader 220 by the support portion 231 and the downward-extending portion 233.

Referring to FIG. 2E, a molding process is performed to form an encapsulation body 250 that encapsulates the front surface 200a of the substrate 200, the chip 210, the power-connecting beat spreader 220, and the ground-connecting heat spreader 230. During molding, a molding compound used for forming the encapsulation body 250 would flow through the mold-flow openings 225, 234 at the support portions 221, 231 of the power-connecting heat spreader 220 and ground-connecting heat spreader 230 respectively, whereby the chip 210 can be assured to be entirely encapsulated by the molding compound. It is preferable to adapt the overhead portion 232 of the ground-connecting heat spreader 230 to be exposed to outside of the encapsulation body 250, thereby helping increase heat-dissipation efficiency for the package structure.

Then, a plurality of solder balls 260 are implanted on the back surface 200b of the substrate 200, including power balls 261 electrically connected to the power vias 201a, ground balls 262 electrically connected to the ground vias 201b, and I/O balls 263 electrically connected to the I/O vias 201c. This therefore completes the fabrication of the BGA package of the invention.

By the above fabricated package structure illustrated in FIG. 2E, power can be externally supplied to the chip 210 successively via the power balls 261, the power vias 201a, the power-connecting heat spreader 220, the power plane 212a, the bonding wires 241, and the power pads 211a. Moreover, the chip 210 can be connected to ground successively via the ground pads 211b, the bonding wires 242, the ground plane 212b, the ground-connecting heat spreader 230, the ground vias 201b, and the ground balls 262. Further, the chip 210 can transfer I/O signals via the I/O pads 211c, the bonding wires 243, the I/O vias 201c, and the I/O balls 263.

Besides power transmission and grounding effect, the power-connecting heat spreader 220 and the ground-connecting heat spreader 230 also help enhance heat dissipation for the packaged chip 210, and thus improve overall heat-dissipation efficiency of the package structure.

Figure 1B:
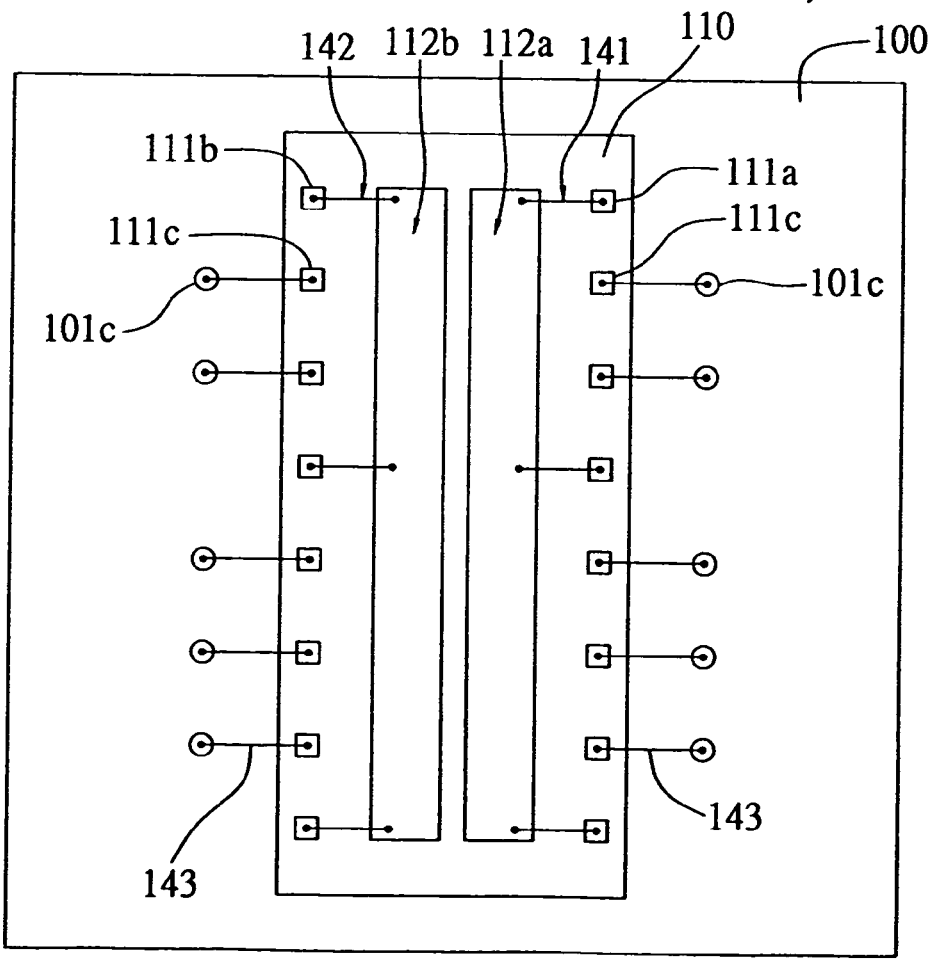

Compared to the package structure in the prior art of FIGS. 1A–1B, the BGA package of the invention has the following advantageous.

First, as the ground connecting heat spreader 230 of the invention is arranged to entirely cover the chip 210, it can provide better EMI (electromagnetic interference) shielding effect for allowing the chip 210 to improve its electrical performance during operation.

Further, as the overhead portion 232 of the ground-connecting heat spreader 230 of the invention is exposed to outside of the encapsulation body 250 that encapsulates the chip 210, better heat-dissipation efficiency is effected for the BGA package of the invention.

Moreover, as the power-connecting heat spreader 220 of the invention entirely covering the chip 210 is sized to be much larger than the prior art of using a power-connecting heat spreader only covering part of a chip, thereby power from an external source can be more efficiently supplied to the chip 210 in the invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a semiconductor package, comprising the steps of:

preparing a substrate having a front surface and a back surface opposed to the front surface, wherein a plurality of I/O (input/output) vias, power vias and ground vias are formed to extend from the front surface to the back surface of the substrate;

mounting at least a chip having an active surface and an inactive surface opposed to the active surface, wherein the active surface is formed with a plurality of I/O pads, power pads and ground pads, and further formed with a power plane and a ground plane in a manner that, the power plane is electrically connected to the power pads, and the ground plane is electrically connected to the ground pads, and wherein the inactive surface of the chip is mounted on the front surface of the substrate;

forming a plurality of bonding wires for electrically connecting the I/O pads on the chip to the I/O vias of the substrate;

mounting a power-connecting heat spreader over the front surface of the substrate; the power-connecting heat spreader having a support portion, an overhead portion supported on the support portion, and a downward-extending portion protruding downwardly from the overhead portion, wherein the support portion is electrically bonded to the power vias of the substrate, and the downward-extending portion is electrically bonded to the power plane on the chip, allowing the overhead portion to be elevated in position above the chip by the support portion and the downward-extending portion in a manner that, the power-connecting heat spreader entirely covers the chip;

mounting a ground-connecting heat spreader over the front surface of the substrate; the ground-connecting heat spreader having a support portion, an overhead portion supported on the support portion, and a downward-extending portion protruding downwardly from the overhead portion, wherein the support portion is electrically bonded to the ground vias of the substrate, and the downward-extending portion is electrically bonded to the ground plane on the chip, allowing the overhead portion to be elevated by the support portion and the downward-extending portion in position above the overhead portion of the power-connecting heat spreader in a manner that, the ground-connecting heat spreader entirely covers the chip;

forming an encapsulation body for encapsulating the front surface of the substrate, the chip, the power-connecting heat spreader and the ground-connecting heat spreader; and implanting a plurality of solder balls on the back surface of the substrate, and electrically bonding the solder balls to the vias.

2. The method of claim 1, wherein the power plane and the ground plane are electrically connected respectively to the power pads and the ground pads by means of wire-bonding technology.

3. The method of claim 1, wherein the power plane and the ground plane are electrically connected respectively to the power pads and the ground pads by means of TAB (tape automated bonding) technology.

4. The method of claim 1, wherein the power-connecting heat spreader and the ground-connecting heat spreader are each an integrally-formed piece of electrically-and-thermally conductive material.

5. The method of claim 1, wherein the overhead portion of the power-connecting heat spreader is formed with an opening, for allowing the downward-extending portion of the ground-connecting heat spreader to penetrate through the opening and to be electrically bonded to the ground plane on the chip.

6. The method of claim 1, wherein the support portion of the power-connecting heat spreader and the support portion of the ground-connecting heat spreader are each formed with at least an opening, for allowing a molding compound used for forming the encapsulation body to pass through the opening.

7. The method of claim 1, wherein the overhead portion of the ground-connecting heat spreader is exposed to outside of the encapsulation body.

* * * * *